United States Patent [19]
Kaskoun et al.

[11] Patent Number: 5,816,478
[45] Date of Patent: Oct. 6, 1998

[54] FLUXLESS FLIP-CHIP BOND AND A METHOD FOR MAKING

[75] Inventors: Kenneth Kaskoun, Chandler; David A. Jandzinski; John W. Stafford, both of Phoenix, all of Ariz.

[73] Assignee: Motorola, Inc., Schaumburg, Ill.

[21] Appl. No.: 465,488

[22] Filed: Jun. 5, 1995

[51] Int. Cl.$^6$ .............................. B23K 1/20; B23K 31/02
[52] U.S. Cl. .................. 228/180.22; 228/203; 228/211; 228/254
[58] Field of Search .................. 228/180.22, 254, 228/203, 211

[56] References Cited

U.S. PATENT DOCUMENTS

| | | | |
|---|---|---|---|
| 4,767,049 | 8/1988 | Butt et al. | 228/203 |
| 4,961,528 | 10/1990 | Peters | 228/254 |
| 5,075,965 | 12/1991 | Carey et al. | 228/180.22 |
| 5,234,149 | 8/1993 | Katz et al. | 228/180.22 |
| 5,346,857 | 9/1994 | Scharr et al. | 228/180.22 |
| 5,385,869 | 1/1995 | Liu et al. | 437/209 |
| 5,402,077 | 3/1995 | Agahdel et al. | 324/758 |

FOREIGN PATENT DOCUMENTS

| | | | |
|---|---|---|---|
| 1665608 | 3/1971 | Germany | 228/254 |
| 52-7349 | 1/1977 | Japan | 228/211 |

OTHER PUBLICATIONS

"High Strength Thermocompression Bonds," *IBM Tech, Discl. Bull.*, Vol. 30, No. 7, Dec. 1987, pp. 208–209.

*Primary Examiner*—Khanh P. Nguyen
*Assistant Examiner*—Jeffrey T. Knapp
*Attorney, Agent, or Firm*—Kenneth M. Seddon; Daniel R. Collopy; Robert D. Atkins

[57] ABSTRACT

A method for flip-chip bonding of two electronic components (27,28) does not use a flux material. A substrate (13) of one electronic component (28) is roughened during processing to provide an improved adhesive surface for a solder ball (12). The roughened pattern is replicated by additional conductive layers formed over the substrate or in an alternate embodiment may be formed on one of the intermediary or top conductive layers. Tacking pressure is applied to the two components so the solder ball (12) will be affixed to the roughened surface and provide a temporary bond. This bond ensures the surfaces of the two electrical components remain in contact with each other during reflow of the solder ball (12) to form a permanent bond.

8 Claims, 3 Drawing Sheets

FLUXLESS FLIP-CHIP BOND AND A METHOD FOR MAKING

BACKGROUND OF THE INVENTION

This invention relates, in general, to semiconductor devices, and more particularly, to two electronic components bonded together without the use of flux.

Semiconductor packaging has revolved around the concept of individually packaging electronic components for later placement on a PC Board. The sole purpose of the package is to provide protection to the electronic component during the assembly and operation of the component. The evolution of the semiconductor industry has created a need for increased integration, miniaturization, and heat dissipation in the packaging of electronic components. Thus the development of flip-chip packaging technology which allows for several components to be combined in one module thus eliminating the need for individual packaging for each component.

In the flip-chip bonding process, solder balls are placed on one of the electronic devices and mated with the appropriate bonding pads of a second electronic device. While the two devices are in contact with each other, the solder is heated and allowed to reflow to form a permanent bond between the two devices.

One of the difficulties with flip-chip technology is the need to keep all of the solder balls in contact with the appropriate bonding pads during the reflow process so that reliable bonds can be formed. A flux material such as rosin has been readily used to adhere the two components of the flip-chip bond and to keep the bonding surfaces free of oxides. After bonding, the flux material must be removed because any remaining residue from the flux will affect the adhesion properties of the solder balls and will corrode the flip-chip module. Flux increases the expense of the flip-chip process and adds severe environmental concerns in the application, removal, and disposal of the flux material.

Fluxless techniques have been experimented with to eliminate the complications of residue films. The most common technique used by those skilled in the art is the application of tacking pressure between the two electronic components. This pressure is intended to force the solder balls of a first electronic component to adhere to a smooth bonding surface of a second electronic component. If too much pressure is applied, however, the solder balls will deform to the extent of shorting to each other or to the substrate of either component.

The use of metallic dendrites as taught by U.S. Pat. No. 5,075,965, which issued to Carey et al. on Dec. 31st, 1991, helps reduce the amount of tacking pressure required by forming metal spikes on the surface of the bonding region. These dendrites are plated with metallic layers and are only used for temporary bonding for "known good die" testing. The dendrite process adds complexity to the packaging process since dendrites are difficult to control and are avoided during normal metallurgical deposition. By now, it should be appreciated that it would be advantageous to provide an improved method for bonding electronic components that does not require the use of a flux material, that eliminates the risks of deforming the solder balls, and does not add appreciable complexity or cost to the manufacturing process.

DETAILED DESCRIPTION OF THE DRAWINGS

Typical flip-chip bonding techniques involve the mating of solder balls of a first electronic component to bonding regions of a second electronic component and holding the structures in place while reflowing the solder to form a permanent electrical bond. To ensure that a reliable bond is formed, it is critical that the solder balls and bonding surfaces remain in contact with each other during the reflow process. Previously known methods of maintaining contact use a flux rosin which acts as a temporary glue layer between the two components. This present invention teaches an effective method for forming a fluxless flip-chip bond between semiconductor devices by tacking the solder balls to a roughened surface formed on the second electronic component. The solder balls adhere to the roughened surface and will provide reliable contact during the reflow process of the solder balls. The present invention can also be used to bond a semiconductor device to a substrate for temporary bonding for a "known good die" test methodology.

Figure 1:
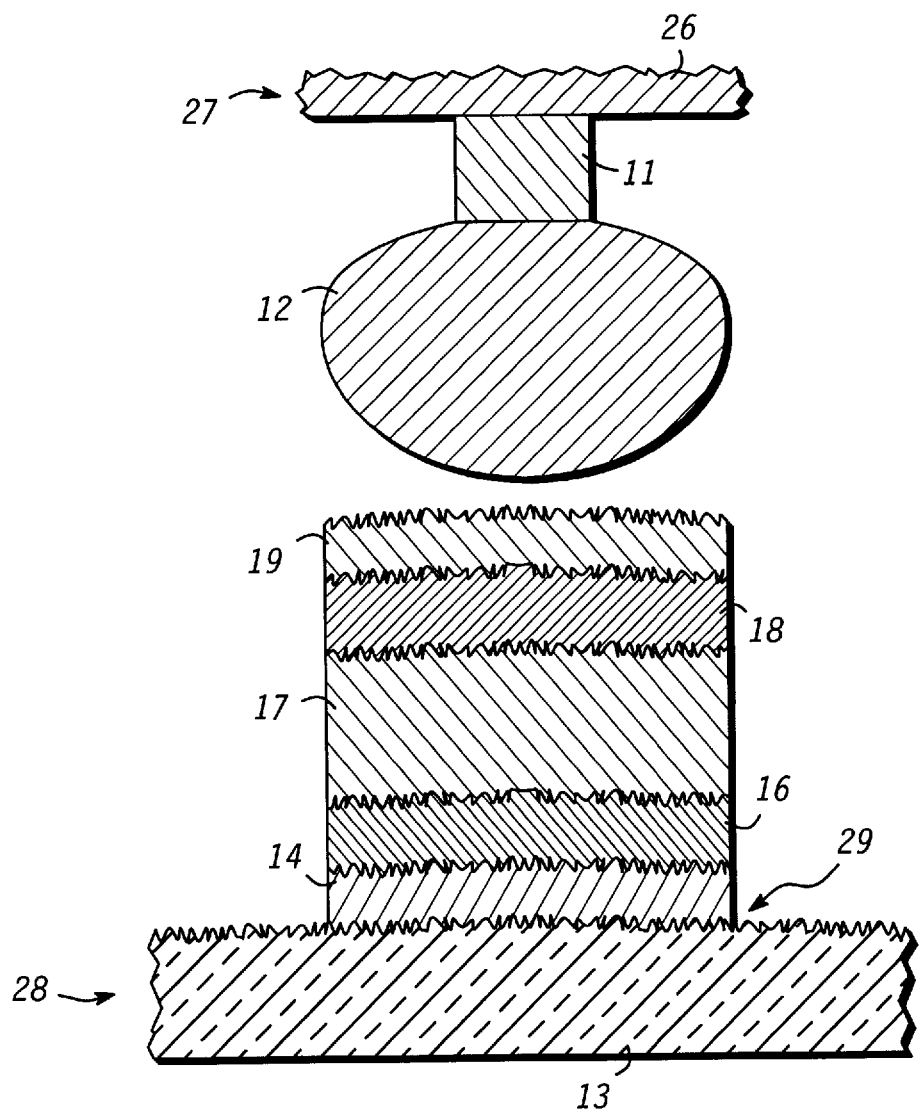
FIG. 1 is an enlarged cross-sectional view showing a first embodiment of the current invention.

FIG. 1 is an enlarged cross-sectional view showing the first embodiment of the current invention. Here the structure and process for flip-chip bonding a glass substrate 13 to a semiconductor will be described, however, the present invention can be used to bond the terminals of two electronic components of any composition or application. The bonding surface of a first electronic component 27 is represented as a conductive substrate 26. Although shown in FIG. 1 as a metal film, substrate 26 can consist of many materials such as silicon, gallium arsenide, glass, a magnetic material, or any other material used in electronic applications. Some applications will require a metallized bonding pad 11 to be formed on substrate 26 of first electronic component 27 via one of the many ways known by those skilled in the art of flip-chip packaging. The function of bonding pad 11 is to provide adhesion for a solder ball 12 which is formed on bonding pad 11. Bonding pad 11 is an interfacial layer between substrate 26 of first electronic component 27 and solder ball 12. It can be made from the alloys of several metals such as copper, tin, silver, chrome, nickel, gold, or aluminum and may not be required depending on composition of substrate 26. Solder ball 12 can be any solderable material and commonly is made of a mixture of lead and tin alloys. Solder ball 12 provides two functions: first it provides temporary adhesion between electronic components 27 and 28 during the assembly and testing process, and secondly it forms a permanent wettable bond between electronic components 27 and 28 when solder ball 12 reflows at temperatures above 85° C.

A second electronic component 28 is shown to have a bonding region 29 made of a glass substrate 13. This again is for illustrative purposes only as the second electronic component 28 can vary in composition as much as first electronic component 27 and thus have bonding regions 29 made of any material used in the electronics industry. The term bonding region 29 refers to the portion of the two electronic components that forms the physical bridge between the two components. This portion is also referred to in the present invention and by those skilled in the art as leads, bonding pads, bonding terminals, bumps, or bond bumps. Glass substrate 13 is roughened to provide roughened surfaces on subsequent conductive layers made on substrate 13. A roughened bonding region 29 will lead to elimination of flux rosin to hold components 27 and 28 in place during the assembly process.

There are several chemical and physical methods for forming the roughened surface on glass substrate 13 and a few will be described here. A masking layer made of exposed and patterned photo resist is used to isolate the regions of substrate 13 to be etched and protect areas not to be etched. Any other physical barrier can be used to selectively roughen the portions of the second electronic component 28. Various chemical etchants can be used depending on the composition of the material to be etched. Most glass substrates can be etched with a solution of hydrofluoric acid. Metallic substrates can be etched with any suitable solution such as Glycol. A plasma etcher can also be used to roughen substrate 13 using a suitable fluorocarbon plasma.

In a preferred embodiment, substrate 13 is physically roughened. A sandblast using a low pressure and fine coarseness abrasive is a preferred method. With flip-chip solder balls on the order of 20 $\mu$m to 200 $\mu$m in diameter, a 1 to 3 second application at 20 to 50 PSI using an abrasive on the order of 0.2 $\mu$m to 20 $\mu$m silica sand is applied to the substrate 13. It is also possible to use any sputtering technique that removes or deposits a sufficient portion of the surface of the substrate to produce a roughened pattern.

If the electronic application requires a conductive bond between the two components, then conductive layers are formed on the bonding regions. Each layer is deposited and formed in such a way as to replicate the roughened surface of substrate 13 with each subsequent layer. First a film of chrome on the order of 100 Å is deposited on substrate 13 to serve as a glue layer 14. A 500 Å copper layer 16 is deposited on glue layer 14. Then a 5 $\mu$m copper layer 17 is deposited on the 500 Å copper layer 16. A 1 $\mu$m nickel layer 18 is deposited on the 5 $\mu$m copper layer 17. Finally a 0.25 $\mu$m gold layer 19 is deposited and acts as a top conductive layer. There are several metallurgical methods used to form the conductive films such as sputtering, electroplating, or vapor deposition. The composition, thickness, or number of layers applied to substrate 13 can vary and are determined by the electronic application and the bonding requirements.

It should be apparent to those skilled in the art that any one of the above mention methods for roughening the bonding surface is a much more effective solution than forming dendrite structures. The dendrite structures require complicated process steps to form and plate the dendrites. Such steps are difficult to control in a manufacturing process and the complexity also increases the assembly expense. The use of a roughened surface does not add the same expense since the conductive layers replicate the roughened surface and do not require additional plating steps as described in the dendrite process. Replication of the roughened texture of the surface of the glass substrate 13 allows for lower tacking pressure to be used during the assembly process. In a typical flip-chip process, once the two components are placed in contact with each other, pressure is applied to deform solder balls 12 such that they will adhere to second component 28. The roughened surface embodiment of this invention reduces the required pressure to bond the two surfaces thus eliminating the risk of deforming the solder balls to an extent that will cause shorting to an adjacent solder ball or conductive lead.

Figure 2:
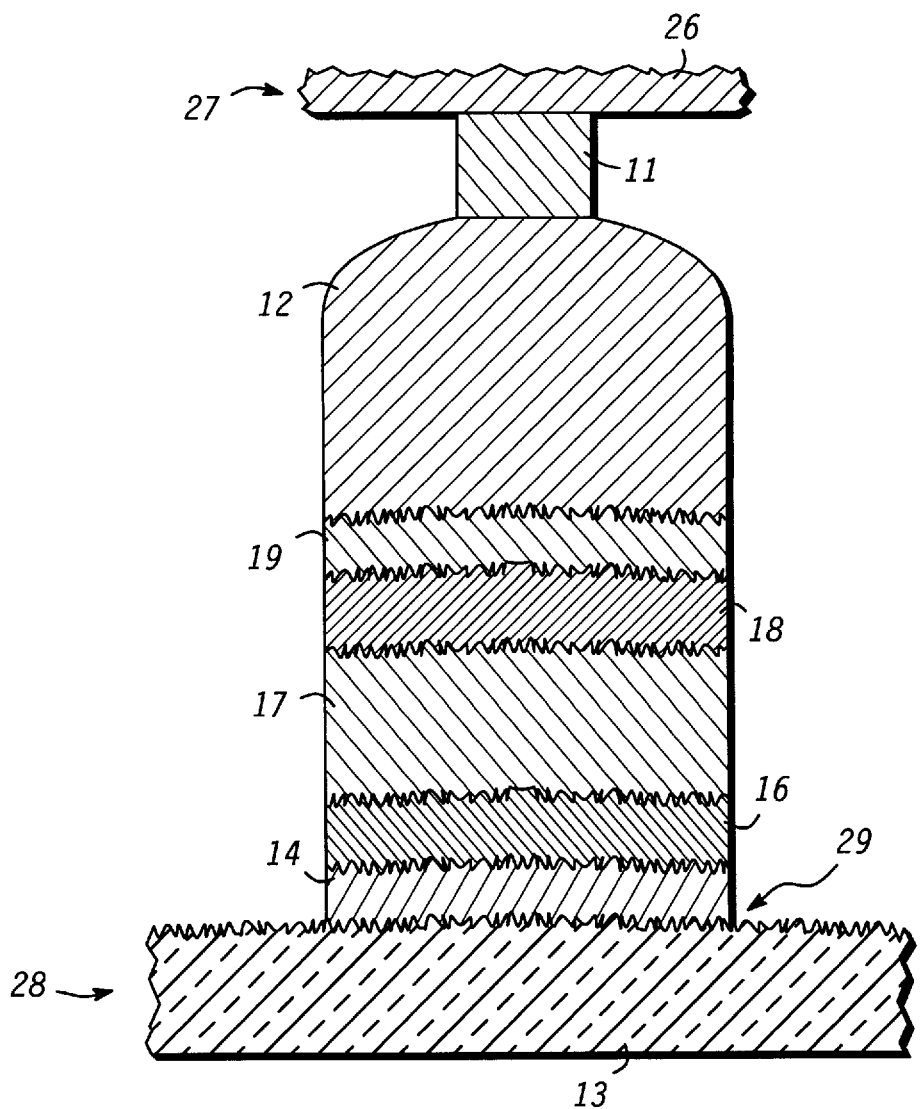
FIG. 2 is an enlarged cross-sectional view showing the first embodiment of the current invention after further processing.

FIG. 2 is an enlarged cross-sectional view showing the first embodiment of the current invention after further processing. The two electronic components 27 and 28 are placed in contact with each other and compressed such that a force of about 0.049 newtons to 0.147 newtons per solder ball is applied normal to the bonding region. If it were not for the roughened surface on layer 19, solder ball 21 would not affix to second electronic component 28 allowing them to separate during subsequent assembly or testing steps. Using the roughened surface also allows for a reduced tacking pressure in the assembly process. Previously known methods of flip-chip assembly required a force of about 0.294 newtons to 9.8 newtons per solder ball which introduces the risk of deforming the solder ball so severely as to cause electrical shorting. The two electronic components 27 and 28 are then heated to the reflow temperature of solder ball 21, typically 150° C. to 400° C. Solder ball 21 will then form a wetted bond between the two electronic components 27 and 28.

Figure 3:
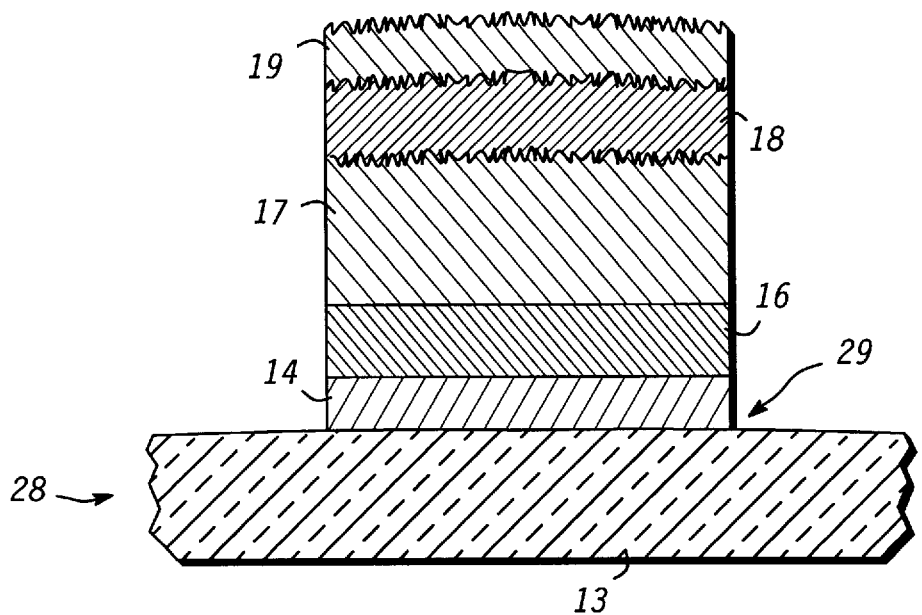
FIG. 3 is an enlarged cross-sectional view showing a second embodiment of the current invention.

FIG. 3 is an enlarged cross-sectional view showing a second embodiment of the current invention. Instead of roughening substrate layer 13 of second electronic component 28, one of the intermediate conductive layers is roughened. FIG. 3 shows the 5 $\mu$m copper layer 17 is roughened and the roughened pattern is replicated by the 1 $\mu$m nickel layer 18 and the 0.25 $\mu$m gold layer 19. Glass substrate layer 13, the 100 Å chrome layer 14, and the 500 Å copper layer are formed and patterned with no roughening. For this embodiment it is possible to roughen any or all of the layers as long as a roughened pattern is present on the top conductive layer. A third embodiment of the present invention (not shown) involves only roughening the top conductive layer such as by coining.

Figure 4:
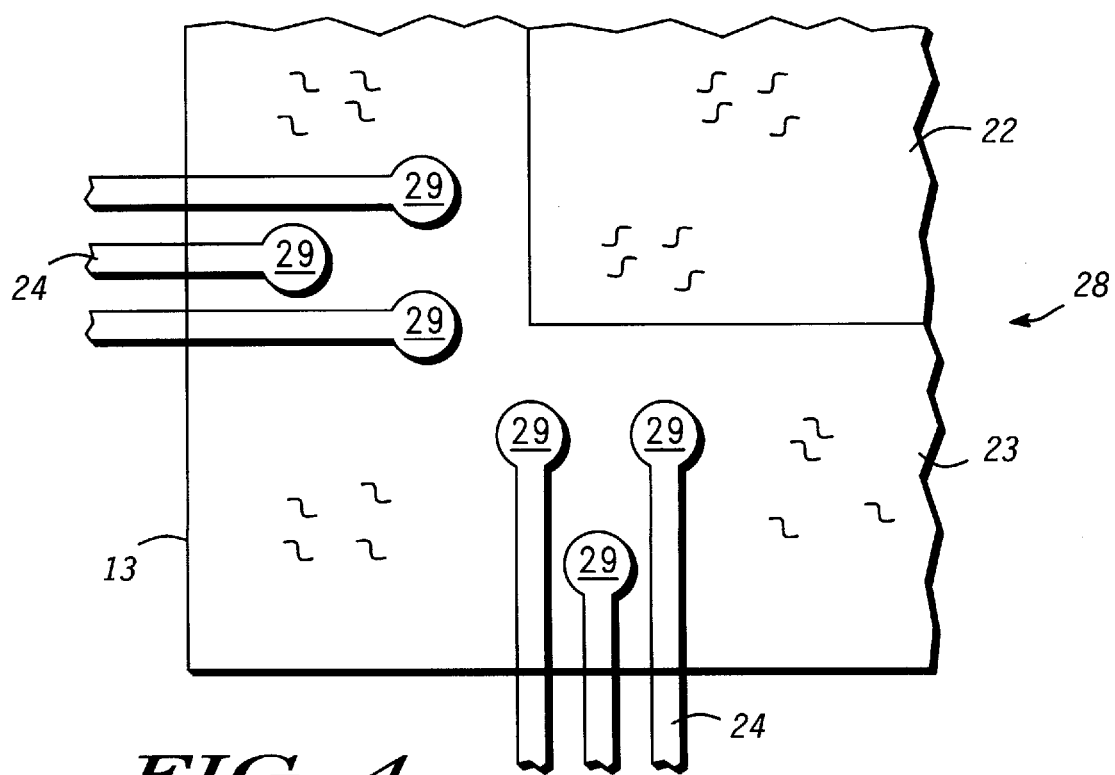
FIG. 4 is a view showing a large portion of a substrate used in an embodiment of the present invention.

FIG. 4 illustrates a large portion of substrate 13. A portion of glass substrate 13 is shown divided into a non-etched portion 22 and an etched portion 23. Using one of the above mentioned techniques, glass substrate 13 is masked and selectively roughened to form roughened surface 23. Roughened surface 23 is where bonding regions 29 are formed attached to leads 24. A sequence of conductive layers 14, 16, 17, 18, and 19 are formed and patterned on roughened surface 23 such that the roughened pattern is replicated on the top layer. The top layer is then placed in contact with solder balls 12 (see FIG. 1). Once solder balls 12 (see FIG. 1) are aligned with bonding regions 29 tacking pressure is then applied to bond components 27 and 28 (FIG. 2). If a permanent bond is desired, solder balls 12 are heated and allowed to reflow to form a wettable bond.

By now it should be appreciated that the present invention provides new methods of flip-chip bonding of two electronic components. The embodiments provide a method for forming a fluxless bond between the leads of any two electronic devices and then applying tacking pressure to hold the two components together during the remaining process steps. The embodiments offer improved efficiency over the prior art, by eliminating the cost of the flux adhesive and issues associated with applying and removing an environmentally hazardous material.

We claim:

1. A fluxless method for bonding a semiconductor device to a substrate comprising:
providing a semiconductor device having a bonding surface;
attaching a solder ball to the bonding surface of the semiconductor device;
providing a substrate having a bonding region;
roughening the bonding region to provide a roughened surface on a top conductive layer, wherein the roughened surface is formed by chemically etching the substrate layer and then replicating the roughened surface with subsequent conductive layers; and
placing the solder ball in contact with the roughened surface of the top conductive layer to temporarily affix the semiconductor device and the substrate.

2. A method for forming a fluxless flip-chip bond between two electronic components comprising:
providing a first electronic component having a bonding region wherein the bonding region comprises a substrate layer and at least one conductive layer formed on the substrate layer;
forming a roughened surface on the bonding region of the first electronic component, wherein the roughened surface is formed by chemically etching the substrate layer and then replicating the roughened surface with subsequent conductive layers;
providing a second electronic component having a bonding surface;
attaching a solder ball to the bonding surface of the second electronic component;
placing the roughened surface in contact with the solder ball;
applying tacking pressure to the two electronic components such that the solder ball adheres to the roughened surface; and
heating the two electronic components such that the solder ball reflows to form a wetted bond between the two electronic components.

3. A method for forming a fluxless flip-chip bond between two electronic components comprising the steps of:
providing a first electronic component having a bonding region wherein the bonding region comprises a substrate layer and at least one conductive layer formed on the substrate layer;
forming a roughened surface on the bonding region of the first electronic component, wherein the roughened surface is formed by chemically etching a conductive layer of the bonding region and then replicating the roughened surface with subsequent conductive layers;
providing a second electronic component having a bonding surface;
attaching a solder ball to the bonding surface of the second electronic component;
placing the roughened surface in contact with the solder ball;
applying tacking pressure to the two electronic components such that the solder ball adheres to the roughened surface; and
heating the two electronic components such that the solder ball reflows to form a wetted bond between the two electronic components.

4. A method for forming a fluxless flip-chip bond between two electronic components comprising the steps of:
providing a first electronic component having a bonding region wherein the bonding region comprises a substrate layer and at least one conductive layer formed on the substrate layer;
forming a roughened surface on the bonding region of the first electronic component, wherein the roughened surface is formed by physically etching the substrate layer and then replicating the roughened surface with subsequent conductive layers;
providing a second electronic component having a bonding surface;
attaching a solder ball to the bonding surface of the second electronic component;
placing the roughened surface in contact with the solder ball;
applying tacking pressure to the two electronic components such that the solder ball adheres to the roughened surface; and
heating the two electronic components such that the solder ball reflows to form a wetted bond between the two electronic components.

5. A method for forming a fluxless flip-chip bond between two electronic components comprising the steps of:
providing a first electronic component having a bonding region wherein the bonding region comprises a substrate layer and at least one conductive layer formed on the substrate layer;
forming a roughened surface on the bonding region of the first electronic component, wherein the roughened surface is formed by physically etching a conductive layer of the bonding region and then replicating the roughened surface with subsequent conductive layers;
providing a second electronic component having a bonding surface;
attaching a solder ball to the bonding surface of the second electronic component;
placing the roughened surface in contact with the solder ball;
applying tacking pressure to the two electronic components such that the solder ball adheres to the roughened surface; and
heating the two electronic components such that the solder ball reflows to form a wetted bond between the two electronic components.

6. A fluxless method for bonding a semiconductor device to a substrate comprising:
providing a semiconductor device having a bonding surface;
attaching a solder ball to the bonding surface of the semiconductor device;
providing a substrate having a bonding region;
forming and patterning at least one conductive layer on the bonding region of the substrate such that a roughened surface is formed on a top conductive layer, wherein at least one conductive layer is roughened by physically etching using a sandblast at about 20 to 50 PSI with a coarseness of about 0.2 $\mu$m to 20 $\mu$m for 1 to 3 seconds;
placing the solder ball in contact with the roughened surface of the top conductive layer to temporarily affix the semiconductor device and the substrate; and
heating the semiconductor device and the substrate such that the solder ball forms a bond with the roughened surface.

7. A fluxless method for bonding a semiconductor device to a substrate comprising the steps of:

provNameiding a semiconductor device having at least one solder ball;

providing a substrate having a bonding region wherein the bonding region has a roughened surface, wherein the roughened surface is formed by sandblasting the substrate at about 20 to 50 PSI with a coarseness of about 0.2 μm to 20 μm for 1 to 3 seconds;

placing the at least one solder ball in contact with the roughened surface of the bonding region;

applying tacking pressure to fasten the semiconductor device to the substrate; and heating the semiconductor device and the substrate such that the at least one solder ball forms a bond.

8. The method of claim 7 wherein the step of applying tacking pressure is done such that about 0.049 newtons to 0.147 newtons of force is applied normal to the semiconductor device.

\* \* \* \* \*